United States Patent [19]

Waizman

[11] Patent Number: 5,113,150
[45] Date of Patent: May 12, 1992

[54] UNITY GAIN INVERTING AMPLIFIER PROVIDING LINEAR TRANSFER CHARACTERISTICS

[75] Inventor: Alex Waizman, Haifa, Israel

[73] Assignee: Intel Corporation, Santa Clara, Calif.

[21] Appl. No.: 708,687

[22] Filed: May 31, 1991

[51] Int. Cl.$^5$ .............................. H03F 3/26; H03F 3/16
[52] U.S. Cl. ................................ 330/264; 330/277; 307/605
[58] Field of Search ................ 330/264, 277; 307/605, 307/603

[56] References Cited

U.S. PATENT DOCUMENTS 3,914,702 10/1975 Gehweiler .......................... 330/264
4,021,747 5/1977 Todokoro .......................... 330/264

FOREIGN PATENT DOCUMENTS 63-257315 10/1988 Japan .................................. 330/264

Primary Examiner—Eugene R. LaRoche
Assistant Examiner—Tan Dinh
Attorney, Agent, or Firm—Blakely, Sokoloff, Taylor & Zafman

[57] ABSTRACT

An inverting amplifier having linear output characteristics is disclosed which includes additional n-channel and p-channel transistors coupled to a classic CMOS inverter circuit. The linear transfer characteristic is achieved with nearly full dynamic $V_{cc}$ range. The invented amplifier yields a linear transfer characteristic by controlling the dimension ratios between each of the transistors. The wide dynamic range, wide bandwidth and low output impedance make the circuit well-suited for use as an output stage of a CMOS operational amplifier.

4 Claims, 3 Drawing Sheets

FIG _ 1A (PRIOR ART)
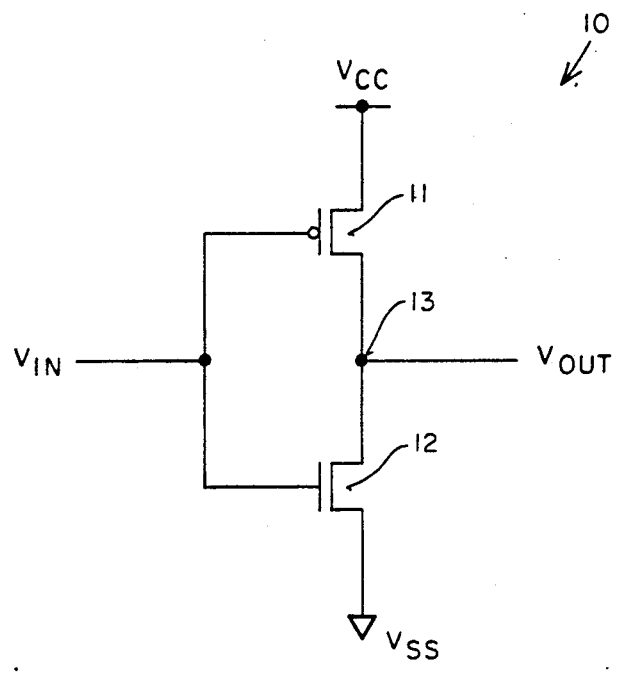
FIG _ 1B (PRIOR ART)
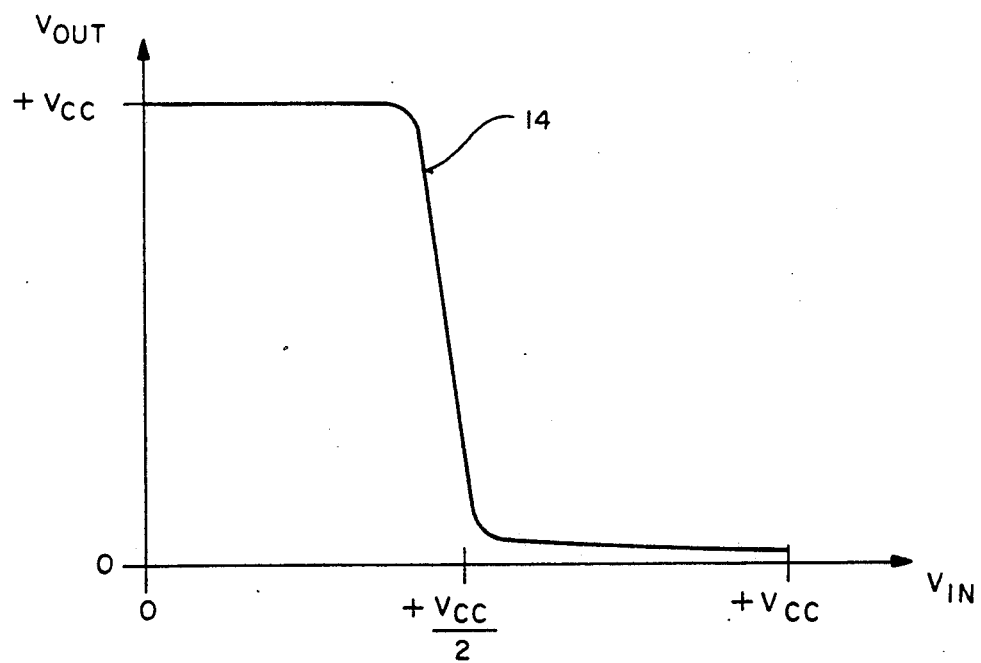

FIG_2 (PRIOR ART)
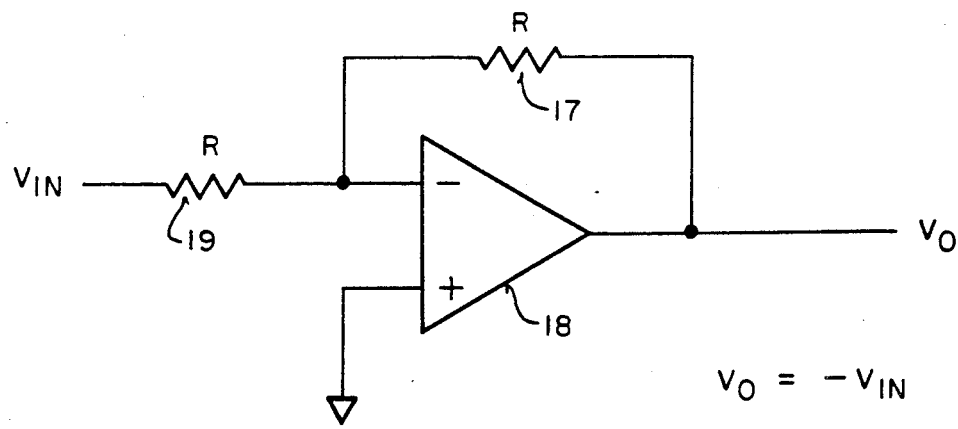
$V_O = -V_{IN}$
FIG_3
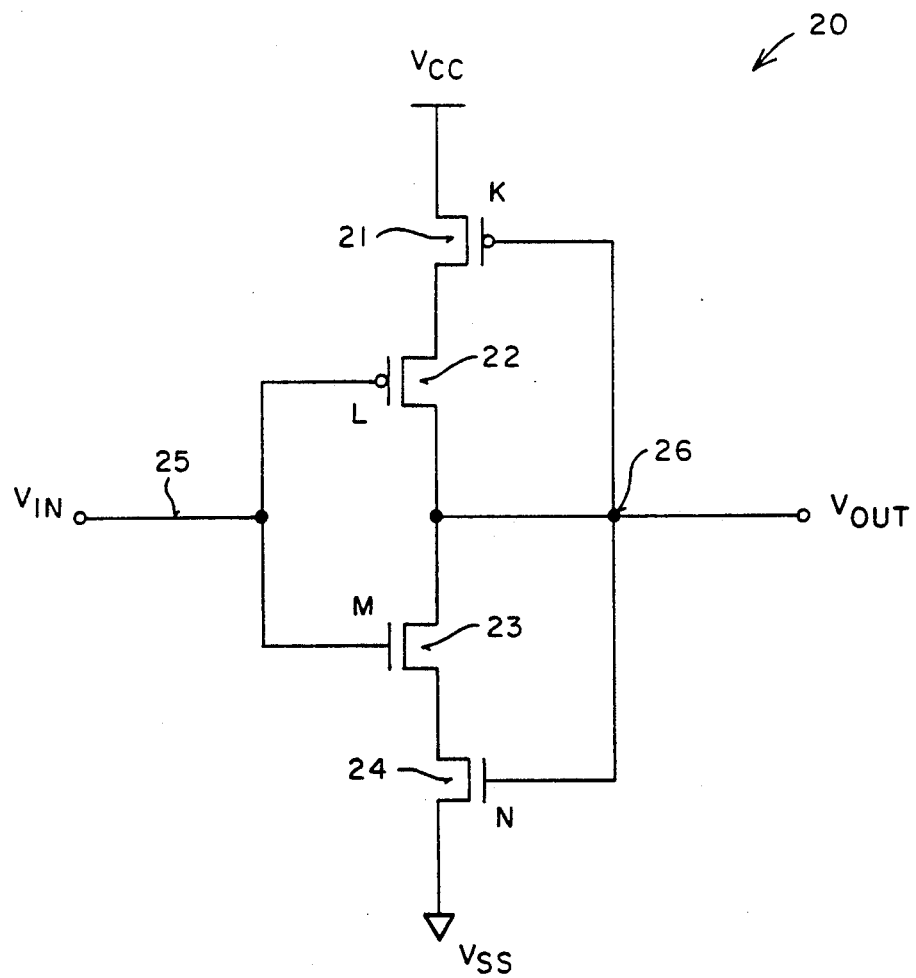

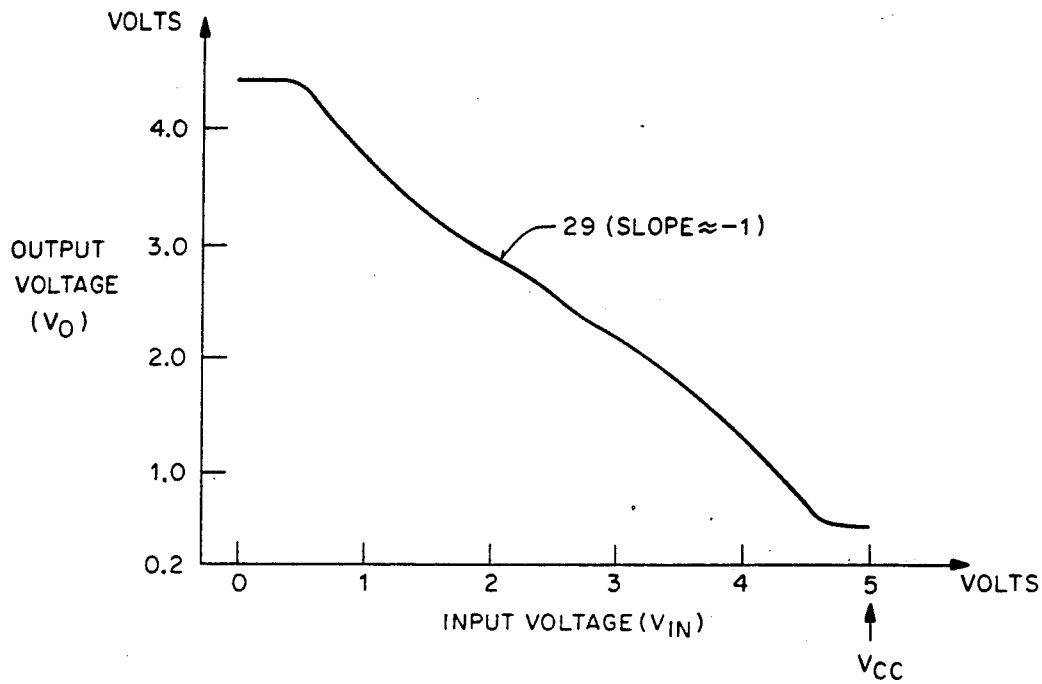
FIG_4
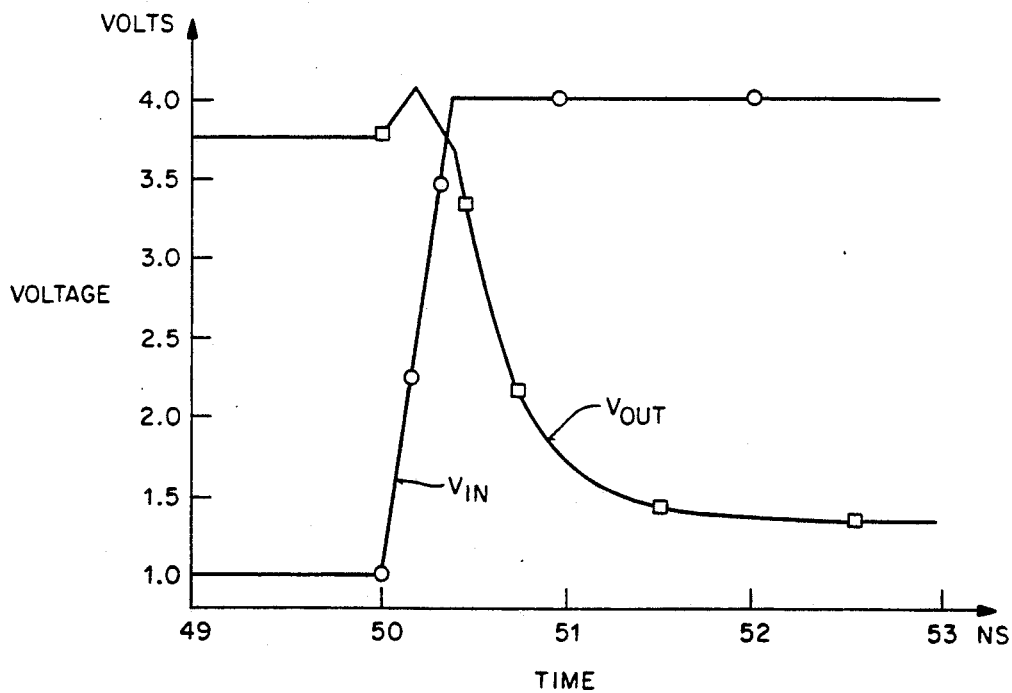
FIG_5

UNITY GAIN INVERTING AMPLIFIER PROVIDING LINEAR TRANSFER CHARACTERISTICS

FIELD OF THE INVENTION

The present invention relates to the field of complimentary-metal-oxide-semiconductor (CMOS) circuits. More specifically, to CMOS circuits which operate with mixed signal analog and digital circuits.

BACKGROUND OF THE INVENTION

Complimentary MOS (CMOS) inverter circuits are extremely well understood within the prior art. FIG. 1A shows a classic CMOS inverter 10. Here, an n-channel transistor 12 and a p-channel transistor 11 are coupled in series between a positive supply potential (e.g., $V_{CC}$) and ground (e.g., $V_{SS}$). Together, transistors 11 and 12 form each other's load resistors. When the input $V_{IN}$ is low, p-channel device 11 is ON and n-channel device 12 is OFF. The output node 13 sees a low resistance to $V_{CC}$.

If there is no load on the output, there is no supply current needed. When the input is high, p-channel device 11 is OFF and the n-channel transistor 12 is ON. For this situation, the output sees a low resistance to ground. Again, no supply current is needed. The only time circuit 10 requires supply current is when the input state is changed because it takes some energy to charge the gate capacitance. In addition, both transistors are partially ON during the transition between logic states.

FIG. 1B shows the transfer function of CMOS inverter 10. The output $V_{OUT}$ changes state exactly halfway between the two extremes of the power supply ($V_{CC}$) and ground ($V_{SS}$); slicing things right down the middle. Note that transfer function 14 illustrates a rapid voltage change about the switching threshold. For many applications this is a desirable characteristic. For example, this type of transfer function gives the best possible noise immunity, both to supply-line and ground-line noise.

In the field of linear analog circuits a frequent requirement is to have an amplifier with a linear inverting transfer function. A common implementation of this type of circuit is shown in FIG. 2. As can be seen, the circuit of FIG. 2 uses an operational amplifier 18 configured with feedback resistors 17 and 19 such that the output voltage $V_0$ is given by $$V_0 = -V_{IN}$$

However, the circuit of FIG. 2 has a number of drawbacks that make the task of integrating this circuit into CMOS VLSI circuits very difficult. Operational amplifier 18 requires a large number of very carefully sized transistors which consume valuable silicon area. In addition, the design of a wide bandwidth, stable operational amplifier with a low closed loop gain is a very complex task. Moreover, the above implementation requires the use of two resistors. In modern CMOS VLSI processes, the availability of reasonable-valued resistors is often very limited.

The present invention offers a solution to these problems by providing a unity gain inverting amplifier having linear transfer characteristics. The invented amplifier is well-suited for use with mixed signal analog/digital VLSI circuits. The present invention is further characterized by a low component count and a gain which is stable across a wide bandwidth range.

SUMMARY OF THE INVENTION

An inverting unity gain CMOS amplifier circuit is described which provides a substantially linear transfer characteristic. The amplifier comprises a plurality of p-channel and n-channel transistors coupled in series between a first and second supply potential. A pair of transistors are configured as a classic CMOS inverter in which the input is coupled to the gates of the p-channel and n-channel transistors. The output node of the inverter is also the output node of the amplifier circuit. All of the other series-coupled complimentary transistors also have their gates coupled to the output node.

The invented circuit yields a linear transfer characteristic by controlling the dimension ratios between each of the transistors. In a preferred embodiment, two p-channel devices are coupled in series with two n-channel devices. The ratio between the sizes of the p-channel devices is 4:1, with the n-channel device size ratios also being maintained at 4:1. The ratio between the p-channel and n-channel transistors of the CMOS inverter is preferably about 3:1.

The wide dynamic range, wide bandwidth and low output impedance make the invented circuit well-suited for use as an output stage of a CMOS operational amplifier.

BRIEF DESCRIPTION OF THE DRAWINGS

FIG. 1A is a circuit schematic diagram of a classical prior art CMOS inverter.

FIG. 1B is a graph illustrating the transfer characteristic of the inverter circuit of FIG. 1A.

FIG. 2 is a prior art inverting, unity gain amplifier.

FIG. 3 is a circuit schematic diagram of the inverting amplifier of the present invention.

FIG. 4 is a graph showing the transfer characteristic of the inverting amplifier circuit of the present invention.

FIG. 5 is a graph showing the step response of the inverting amplifier circuit of the present invention.

DESCRIPTION OF THE PREFERRED EMBODIMENT(S)

A unity gain inverting amplifier providing linear transfer characteristics is described. In the following description, numerous specific details are set forth, such as device types, sizes, voltages, etc., in order to provide a thorough understanding of the present invention. However, it will be obvious to one skilled in the art that the present invention may be practiced without these specific details. In other instances, well known elements have not been shown or described in extensive detail to avoid unnecessarily obscuring the present invention.

FIG. 3 illustrates a circuit schematic diagram of the CMOS inverting amplifier 20 of the present invention. Amplifier 20 comprises a pair of p-channel MOS transistors 21 and 22 coupled in series between the positive supply potential $V_{CC}$ and output node 26. Amplifier 20 also includes a pair of n-channel transistors 23 and 24 coupled in series between output node 26 and ground (e.g., $V_{SS}$). Both transistors 21 and 24 have their gates coupled to output node 26, while transistors 22 and 23 have their gates coupled to input node 25.

If one were to ignore transistors 21 and 24, the remaining circuit would look much like a classic CMOS inverter. That is, transistors 22 and 23 both receive input voltage $V_{IN}$ at node 25 and provide an output at node 26. However, the addition of transistors 21 and 24 (each having their gates coupled to output node 26) modifies the transfer characteristic; making it much more linear. The degree of linearity achieved is dependent upon the device size ratios of each of the transistors in amplifier circuit 20. The ratio of width over length of the transistor dimensions for devices 21-24 is shown in FIG. 3 by capital letters K-N, respectively. This aspect of the present invention will be discussed in more detail shortly.

To better understand the operation of the circuit of FIG. 3, consider the following example. Assume that the input voltage $V_{IN}$ is changed gradually from a voltage slightly below $V_{CC}/2$ to a voltage slightly above $V_{CC}/2$. Ignoring devices 21 and 24 for the time being, the CMOS inverter comprising transistors 22 and 23 would normally switch from $V_{CC}$ to 0 V in response to a change of a few hundred millivolts in $V_{IN}$ around $V_{CC}/2$. The classic CMOS inverter has high gain about the $V_{CC}/2$ voltage. However, the presence of transistors 21 and 24 reduces the gain of this inverter. Increasing $V_{IN}$ above $V_{CC}/2$ causes stronger conduction of transistor 23 and weaker conduction of transistor 22, thereby driving $V_0$ below the $V_{CC}/2$ balance point. As the gates of transistors 21 and 24 are coupled to the output, decreasing $V_0$ causes transistor 21 to conduct more strongly and transistor 24 to conduct more weakly.

The net effect is that additional transistors 21 and 24 function to counteract the normally abrupt switching characteristic of the CMOS inverter pair. Thus, the transfer characteristic of amplifier 20 is linearized by the negative feedback provided by additional transistors 21 and 24.

The degree of linearity which is achieved by buffer 20 is dependent upon the relative device sizes of transistors 21-24. In the currently preferred embodiment, the device sizes are: K=74.2; L=296.8; M=100; and N=25. Note that the device ratio between transistor 22 and 23 is maintained at approximately 3:1, which is a common CMOS relationship between the size of the p-channel to n-channel transistors. This device ratio insures that for $V_{IN}=V_{CC}/2$ (balance point), that $V_0$ also equals $V_{CC}/2$.

In addition, the ratio between p-channel transistors 22 and 21 is preferably 4:1. This 4:1 device size ratio is also maintained between n-channel transistors 23 and 24. The transfer characteristic 29 generated by the present invention with the above device sizes is shown plotted in FIG. 4. The device size ratios specified produce a linear characteristic having a slope of approximately −1.

Of course, it is appreciated that other device size ratios would produce similar linear transfer curves, but having different slopes. Still other embodiments may employ more than four transistors to achieve the desired output. The important point is that whatever the number of additional complimentary devices employed (beyond the basic CMOS inverter), the additional devices are sized to limit the conduction of the CMOS inverters' transistors. It is worth noting that the linearity of the transfer function is maintained to a high degree of accuracy (within 0.5 V of the $V_{CC}$ and $V_{SS}$ power supplies) such that the normally abrupt transfer characteristic is linearized.

Since the device count from the input to output nodes is low, the inverting amplifier has a relatively wide bandwidth. For the typical dimension rations mentioned above, and for a process wherein the effective length of the transistor channel is 0.6 microns, the simulated transition time is approximately 1 nanosecond. This corresponds to an approximately 350 MHz bandwidth, as shown in FIG. 5.

It is appreciated that inverting amplifier 20 can be used in a variety of applications. As the output swing dynamic range approaches almost a full $V_{CC}$ swing, amplifier 20 may be used, for example, as output buffer of a CMOS operational amplifier. The local negative feedback of transistors 21 and 24 helps to reduce the normally high output resistance of the CMOS inverter. Implementing the invented circuit in the closed-loop of an operational amplifier, would further improve the linearity of the transfer function.

I claim:

1. A CMOS amplifier circuit comprising:
   first and second p-channel MOS transistors coupled in series between a first supply potential and an output node;
   first and second n-channel MOS transistors coupled in series between said output node and a second supply potential;
   wherein the gates of said first p-channel and n-channel transistors are commonly coupled to said output node, and the gates of said second p-channel and n-channel transistors are commonly coupled to an input node, and further wherein each of said transistor has a relative device size such that the voltage at said output node varies in a substantially linear manner in response to the voltage applied to said input node, and;
   wherein the device size between second p-channel and said first p-channel transistors have a ratio approximately 4:1.

2. The circuit of claim 1 wherein the device size ratio between said second n-channel and said first n-channel transistors is approximately 4:1.

3. The circuit of claim 2 wherein the device size ratio between said second p-channel and said second n-channel transistors is approximately 3:1.

4. The circuit of claim 3 wherein said first supply potential is approximately 5.0 volts, and said second supply potential is approximately ground.

* * * * *